(12) United States Patent
Kuo et al.

(10) Patent No.: US 12,739,991 B2
(45) Date of Patent: Sep. 15, 2026

(54) ELECTRONIC DEVICE WITH METALLIZED PLASTIC HOUSING STRUCTURE

(71) Applicant: WISTRON NEWEB CORPORATION, Hsinchu (TW)

(72) Inventors: Yu-Fu Kuo, Hsinchu (TW); Yuan-Chin Hsu, Hsinchu (TW); Hsiao-Chan Chang, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 180 days.

(21) Appl. No.: 18/433,605

(22) Filed: Feb. 6, 2024

(65) Prior Publication Data

US 2024/0407116 A1 Dec. 5, 2024

(30) Foreign Application Priority Data

Jun. 2, 2023 (TW) ................................ 112120631

(51) Int. Cl.

*H05K 5/02* (2006.01)
*H01R 13/52* (2006.01)
*H05K 5/00* (2025.01)

(52) U.S. Cl.

CPC ......... *H05K 5/0247* (2013.01); *H05K 5/0047* (2013.01); *H05K 5/0069* (2013.01); *H01R 13/521* (2013.01)

(58) Field of Classification Search

CPC ...... H01R 13/521; H01R 13/00; H01R 13/02; H01R 13/193; H01R 13/22; H01R 13/40; H01R 13/73; H05K 5/0047; H05K 5/0069; H05K 5/0247

USPC ........................................................ 361/752

See application file for complete search history.

(56) References Cited

U.S. PATENT DOCUMENTS 9,899,757 B2 * 2/2018 Do ......................... H01R 13/08
9,948,018 B2 * 4/2018 Wagman ................ H01R 12/77
2017/0069993 A1 * 3/2017 Wagman ................ H01R 43/16
2023/0171888 A1 * 6/2023 Kim ....................... H05K 1/113 174/250

FOREIGN PATENT DOCUMENTS

CN 106505334 A 3/2017
WO WO-2014205964 A1 * 12/2014 ............ A63H 33/08

* cited by examiner

*Primary Examiner* — Imani N Hayman
*Assistant Examiner* — Ross Terry Mularski
(74) *Attorney, Agent, or Firm* — McClure, Qualey & Rodack, LLP

(57) ABSTRACT

An electronic device includes a housing, a first metal trace, a conductive pillar, a circuit board, and a metal connecting element. The housing includes a conductive via and a concave hole, and the conductive via passes through the housing. The first metal trace is disposed on an inner surface of the housing, and the conductive via is electrically connected to the first metal trace. The conductive pillar is disposed in the concave hole and exposed from the housing, and the conductive pillar is electrically connected to the conductive via. The circuit board is disposed inside the housing. The metal connecting element is disposed on the circuit board and electrically connected to the first metal trace.

13 Claims, 7 Drawing Sheets

ELECTRONIC DEVICE WITH METALLIZED PLASTIC HOUSING STRUCTURE

CROSS-REFERENCE TO RELATED PATENT APPLICATION

This application claims the benefit of priority to Taiwan Patent Application No. 112120631, filed on Jun. 2, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device, in particular to an electronic device in which a plastic metallization process is performed on a housing.

BACKGROUND OF THE DISCLOSURE

Existing portable electronic products, such as wireless earphones, smart wristbands, and smartwatches, have complex designs for their internal charging circuits. The charging terminals and the internal circuit boards of these products establish conductivity through indirect contacts through multiple sub-circuit boards or cables. However, such designs require disposing multiple electronic components within the products, which hinders miniaturization and restricts the design of other components due to the space occupied internally.

Therefore, how to overcome the aforementioned drawbacks through improved structural design has become one of the important challenges to solve in the field.

SUMMARY OF THE DISCLOSURE

The technical problem to be solved by the present disclosure is to provide an electronic device for the deficiencies of the prior art, so as to solve the insufficiency that the structural design of the charging terminal of the existing miniaturized electronic products takes up too much internal space of the product.

In response to the above-referenced technical inadequacies, one of the technical solutions adopted by the present disclosure is to provide an electronic device which includes a housing, a first metal trace, a conductive pillar, a circuit board, and a metal connecting element. The housing includes a conductive via and a concave hole, and the conductive via passes through the housing. The first metal trace is disposed on an inner surface of the housing, and the conductive via is electrically connected to one end of the first metal trace. The conductive pillar is disposed in the concave hole and exposed from the housing, and the conductive pillar is electrically connected to the conductive via. The circuit board is disposed inside the housing. The metal connecting element is disposed on the circuit board and electrically connected to the first metal trace.

One of the beneficial effects of the present disclosure is that the electronic device provided by the present disclosure can replace cables or multiple sub-boards of the prior art by utilizing the technical solution of "the first metal trace disposed on the inner surface of the housing, and the conductive via electrically connected to one end of the first metal trace", "the conductive pillar disposed in the concave hole and exposed from the housing, and the conductive pillar electrically connected to the conductive via", and "the metal connecting element disposed on the circuit board and electrically connected to the first metal trace", and through the plastic surface metallization process to form a conductive circuit on the inner surface of the housing. The conductive circuit can be designed on the inner surface of the housing based on the visible conductive pillar position, and the internal and external circuits are connected through conductive via. In addition, the conductive circuit and the circuit board can be electrically connected through metal connecting elements. Since the conductive circuit is freely designed on the inner surface of the housing, the metal connecting elements are not limited to being placed below the charging terminals. As a result, the metal connecting elements do not occupy space on the main circuit board, so as to improve the utilization of internal space in the product and eliminate constraints on the circuit layout of the main circuit board due to limited space.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
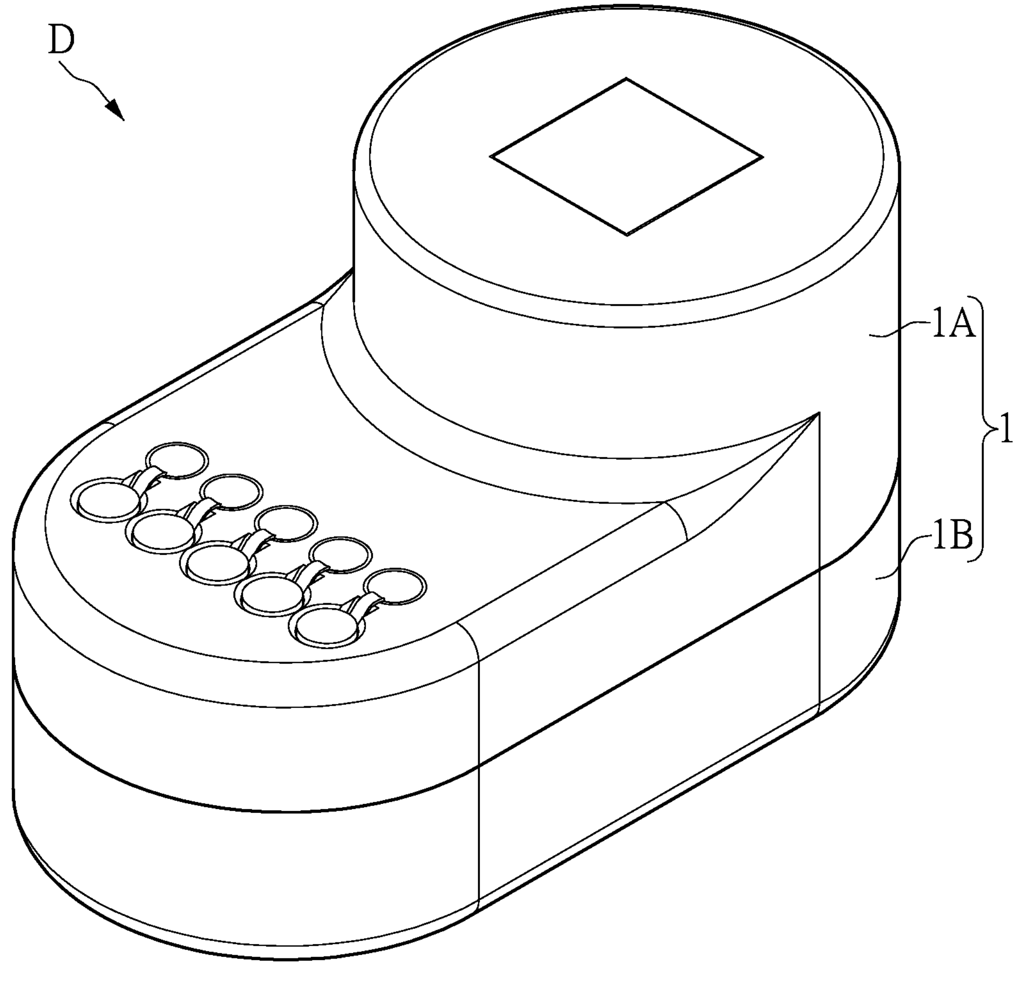
FIG. 1 is a schematic view of an electronic device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like. Furthermore, the term 'or' used herein should be interpreted to include any one or more combinations of the listed items as appropriate in a given context. Additionally, the term 'connect' throughout the entire disclosure refers to a physical connection between two components, which can be either a direct or an indirect connection.

First Embodiment

Figure 2:
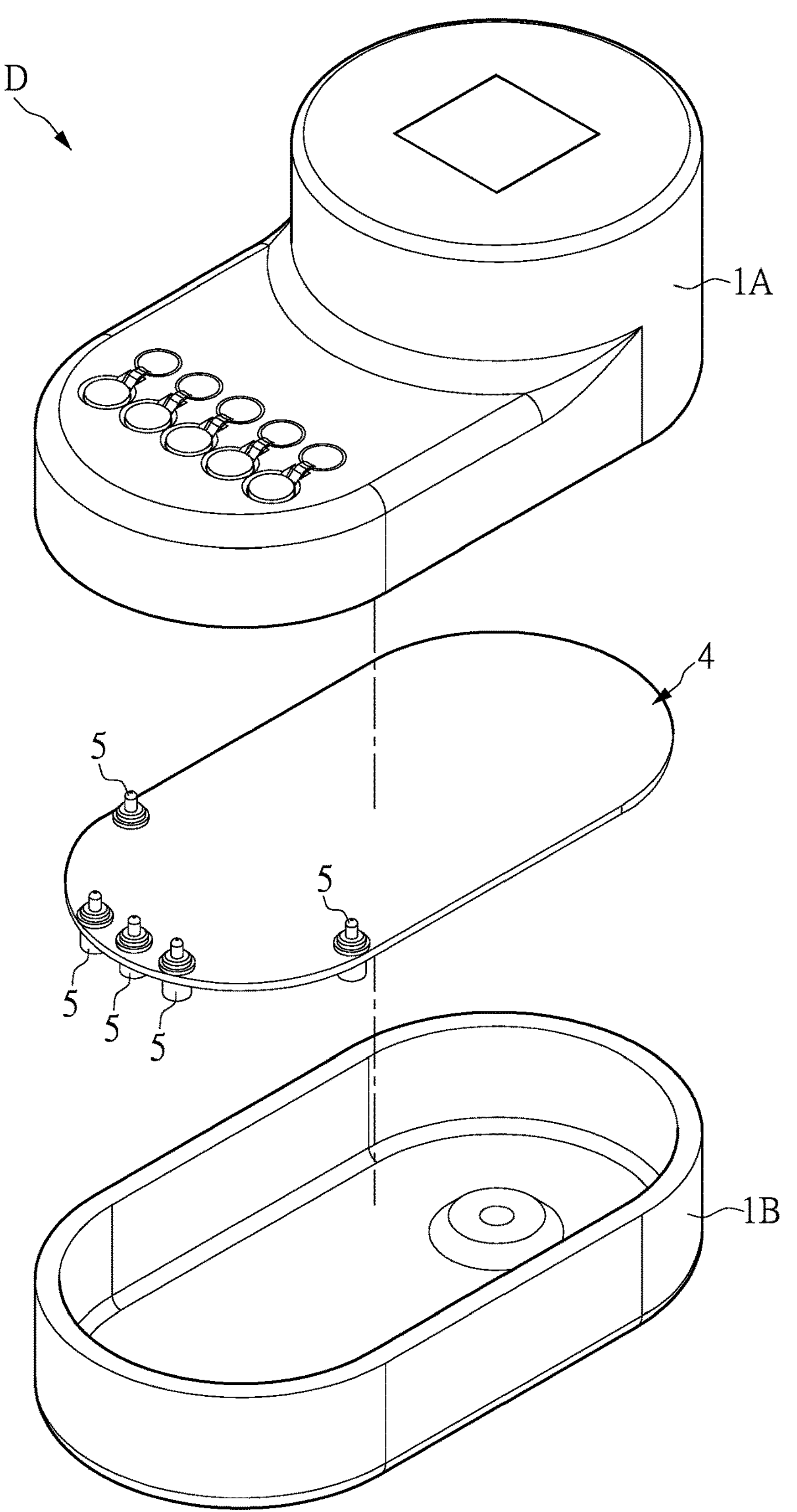
FIG. 2 is a schematic exploded view of the electronic device according to the first embodiment of the present disclosure.
Figure 3:
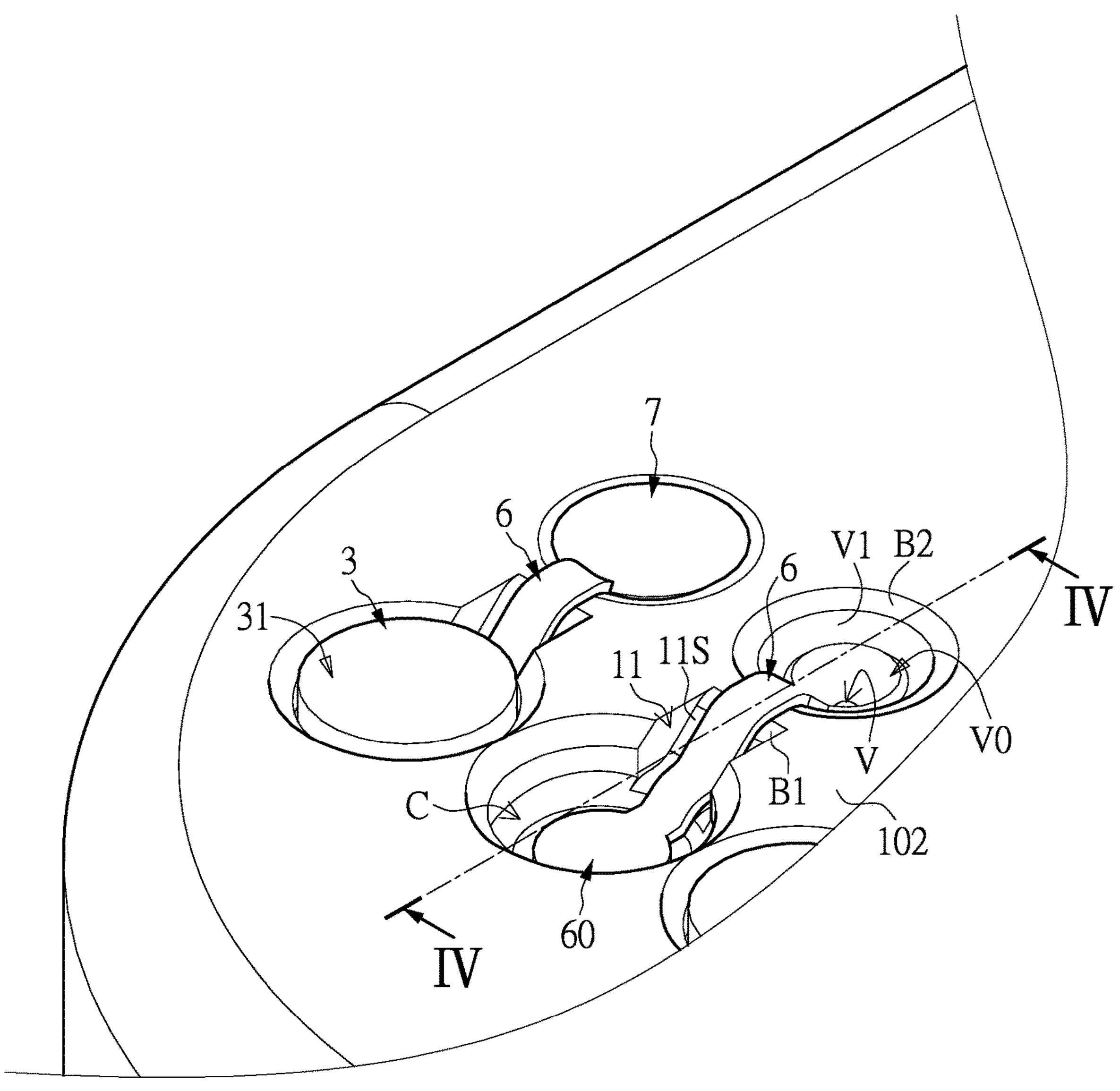
FIG. 3 is a partially enlarged view of the electronic device according to the first embodiment of the present disclosure.
Figure 4:
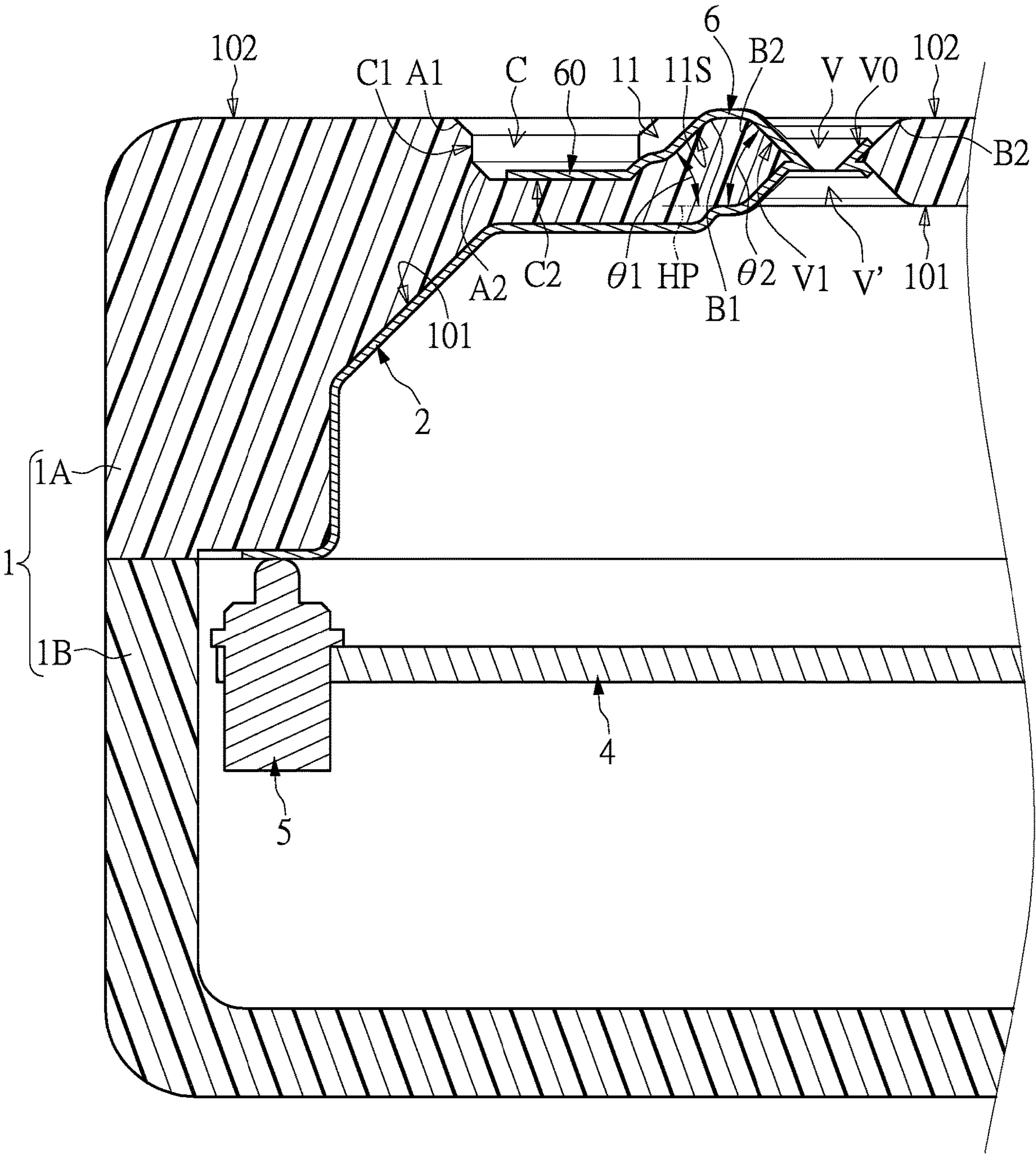
FIG. 4 is a schematic cross-sectional view of IV-IV cross section of FIG. 3.

Referring to FIGS. 1 to 4. FIG. 1 is a schematic view of an electronic device according to a first embodiment of the present disclosure. FIG. 2 is a schematic exploded view of the electronic device according to the first embodiment of the present disclosure. FIG. 3 is a partially enlarged view of the electronic device according to the first embodiment of the present disclosure. FIG. 4 is a schematic cross-sectional view of IV-IV cross section of FIG. 3. The first embodiment of the present disclosure provides an electronic device D which includes a housing 1A, a first metal trace 2, a conductive pillar 3, a circuit board 4, and a metal connecting element 5.

The housing 1A includes a conductive via V and a concave hole C. The concave hole C is adjacent to the conductive via V. Specifically, the electronic device D further includes a lower housing cover 1B. The housing 1A and the lower housing cover 1B together form an outer casing 1. The conductive via V and the concave hole C are disposed on the housing 1A. The housing 1A further includes an inner surface 101 and an outer surface 102. The first metal trace 2 is disposed on the inner surface 101 of the housing 1A. The conductive via V passes through the housing 1A, and two ends of the conductive via V are respectively exposed from the inner surface 101 and the outer surface 102. The concave hole C is disposed on the outer surface 102, and the conductive pillar 3 is disposed in the concave hole C and exposed from the housing 1A. As shown in FIGS. 3 and 4, the height of the conductive pillar 3 is not greater than the depth of the concave hole C. The depth of the concave hole C is a distance from a bottom surface C2 of the concave hole C to the outer surface 102 of the housing 1A. In other words, a surface 31 of the conductive pillar 3 is not higher than the outer surface 102 of the housing 1A, but rather flush or lower than the outer surface 102. By the structural design that the height of the conductive pillar 3 is not greater than the depth of the concave hole C, the risk of the conductive pillar 3 detachment due to improper external impacts or pulls can be reduced.

In the present disclosure, the housing 1A is a plastic housing. The first metal trace 2 is a metal wire pattern formed on the surface of the housing 1A using plastic metallization process. For example, the first metal trace 2 can be produced by using Laser Direct Structuring (LDS) technology. LDS technology is to use special plastic injection molding to activate the metal particles on the plastic surface by laser, and then form metal traces on the plastic surface by electroplating and/or chemical plating. However, the present disclosure is not limited to the way of structuring the first metal trace 2 as mentioned.

In the first embodiment, the structuring of the conductive via V is formed by first forming a through hole by injection molding, and then metallizing the inner surface of the through hole. For example, in addition to the above-mentioned LDS process, the metallization process of the inner surface of the through hole may also include Laser activating plating (LAP), Laser catalyzer plating (LCP), Laser chemical surface (LCS) treatment, Cold Plasma Spray (CPS) treatment, Physical vapor deposition (PVD), Laser shock peening (LSP) treatment, and Photo Direct Structure (PDS). The present disclosure is not limited thereto.

As shown in FIGS. 2 and 4, the circuit board 4 and the metal connecting element 5 are disposed inside the outer casing 1. The metal connecting element 5 is disposed on the circuit board 4, and is electrically connected to the electronic component (not shown in the figure) on the circuit board 4. For example, the electronic component can be, e.g., batteries or other IC components, and the present disclosure is not limited thereto. One end of the first metal trace 2 is electrically connected to the conductive via V, and the first metal trace 2 is connected to the metal connecting element 5. In the embodiments of the present disclosure, the five first metal traces 2 are respectively and electrically connected to the five conductive vias V, and the five first metal traces 2 extend along the inner surface 101 of the housing 1A to the edge of the housing 1A. the five metal connecting elements 5 are disposed along the edge of the circuit board 4. Since the circuit board 4 is below the housing 1A, the metal connecting elements 5 at the edge of the circuit board 4 respectively abuts against the first metal traces 2 which extend to the edge of the housing 1A, thereby generating electrical conduction. In addition, in the first embodiment, the five concave holes C are disposed on the housing 1A and respectively correspond to the five conductive via V. The five conductive pillars 3 are respectively disposed in the five concave holes C. However, the example as mentioned is one of the feasible embodiments and is not intended to limit the present disclosure. The present disclosure is not limited by the number, length, and extension trajectory of the first metal traces 2, nor is the present disclosure limited by the number of the metal connecting elements 5. The present disclosure is also not limited by the number of the conductive vias V and the concave holes C. In addition, for example, the metal connecting elements 5 can be pogo pins, metal springs, or on-board contacts, and the present disclosure is not limited thereto.

As shown in FIGS. 3 and 4, the housing 1A further has an inclined groove. The inclined groove 11 is communicated with the concave hole C, and is located between the concave hole C and its corresponding conductive via V. The inclined groove 11 has a slope surface 11S, and the slope surface 11S slopes downward from the side close to the conductive via V toward the side close to the concave hole C. The slope surface 11S has a first inclination angle θ1 relative to a horizontal plane HP. The first inclination angle θ1 is greater than 30 degrees, and a first rounded structure B1 is between the slope surface 11S and the outer surface 102 of the housing 1A.

The concave hole C includes an inner sidewall C1 and a bottom surface C2. In addition, it should be noted that the outer surface 102 of the housing 1A does not include the inner sidewall C1 and the bottom surface C2 of the concave hole C, nor does it include the slope surface 11S of the inclined groove 11. As shown in FIGS. 3 and 4, a chamfered structure A1 is formed between the outer surface 102 of the housing 1A and the inner sidewall C1 of the concave hole C, and a second chamfered structure A2 is formed between the inner sidewall C1 of the concave hole C and the bottom surface C2 of the concave hole C. Through the design of the first chamfered structure A1 and the second chamfered structure A2, the conductive post 3 can be guided so that it can be easily placed into the concave hole C and located at the center of the concave hole C.

The conductive via V forms a conical hole wall V1 on the side facing the outer surface 102. The conical hole wall V1 has a second inclination angle θ2 relative to the horizontal plane HP, and the second inclination angle θ2 is greater than 30 degrees. There is a second rounded structure B2 between the conical hole wall V1 and the outer surface 102 of the housing 1A. Therefore, as shown in FIG. 4, the conical hole wall V1 of the conductive via V and the slope surface 11S of the inclined groove 11 are inclined surface structure. Thus, through the design of the first rounded structure B1 and the second rounded structure B2, as well as the design of the conical hole wall V1 and the slope surface 11S, it is beneficial to form a surface metallization on the surface in the form of LDS, which is convenient for laser processing. If the connection between the slope surface 11S and the outer surface 102 of the housing 1A is an acute angle structure instead of the first rounded structure B1, or the connection between the conical hole wall V1 and the outer surface 102 of the housing 1A is the acute angle structure instead of the second rounded structure B2, it is more difficult to form a metallization structure on the surface of these connections. Similarly, if the conical hole wall V1 of the conductive via V and the slope surface 11S of the inclined groove 11 is not inclined enough (the first inclination angle θ1 and the second inclination angle θ2 are less than 30 degrees), it is difficult for the laser beam to hit the conical hole wall V1 and the slope surface 11S at an appropriate incident angle to form surface metallization.

As shown in FIGS. 3 and 4, in the first embodiment, the electronic device D further includes a second metal trace 6 disposed on the outer surface 102 of the housing 1A. The way of forming the second metal trace 6 is similar to the way of forming the first metal trace 6, and will not be repeated herein. It should be noted that, in order to clearly show the second metal trace 6, the conductive pillar 3 is omitted in one of the concave holes C in FIG. 3. One end of the second metal trace 6 extends into the conductive via V along the second rounded structure B2 and the canonical hole wall V1, and is electrically connected to the metal layer V0 in the conductive via V; the other end of the second metal trace 6 extends into the concave hole C along the first rounded structure B1 and the slope surface 11S of the inclined groove 11, and forms a circular metal portion 60 on the bottom surface C2 of the concave hole C. The conductive pillar 3 is disposed in the concave hole C and connected to the circular metal portion 60 by soldering, so that the conductive pillar 3 is electrically connected to the conductive via V through the second metal trace 6. However, the present disclosure is not limited to the method of connecting the conductive pillar 3 to the second metal trace 6 as mentioned before. In addition to soldering, the conductive pillar 3 can also be connected to the second metal trace 6 by reflow or conductive glue to achieve electrical conduction. Therefore, the second metal trace 6, the conductive via V, the first metal trace 2 and the metal connecting element 5 form a conductive path between the conductive pillar 3 and the electronic component (not shown) on the circuit board 4. When the electronic component is a battery, the electronic device D can use the conductive pillar 3 to electrically connect to an external power source, and charge the battery through the conductive path.

Furthermore, it should be noted that, in FIGS. 2 and 3, the second metal trace 6 is exposed from the outer surface 102 of the housing 1A. However, in practical applications, after the second metal trace 6 is disposed on the outer surface 102, the second metal trace 6 and the outer surface 102 are covered by a layer of spray paint. Therefore, the second metal trace 6 is not exposed from the appearance of the electronic device D in practical applications.

In addition, as shown in FIG. 3, the electronic device D further includes a waterproof element 7. The waterproof element 7 is disposed in the conductive via V, and is located on the side of the conductive via V facing the outer surface 102. However, the present disclosure is not limited thereto. In other embodiments, the waterproof element 7 can also be disposed on the side of the conductive via V facing the inner surface 101 (i.e., a concave cavity V' in FIG. 4). Alternatively, the waterproof element 7 can also be disposed on both sides of the conductive via V facing the outer surface 102 and the inner surface 101. That is, it is simultaneously disposed in the conductive via V on the outer side of the housing 1A and in the concave cavity V' on the inner side of the housing 1A. It should be noted that, in order to clearly show the second metal trace 6, the waterproof element 7 is omitted in one of the conductive vias V in FIG. 3.

The present disclosure is not limited to the specific implementation of the waterproof element 7. As shown in FIG. 2, for example, the waterproof element 7 can be waterproof silicone, which is filled in the five conductive vias V by dispensing; or, the waterproof element 7 can be waterproof gum, which is directly pasted on all of the conductive vias V.

Second Embodiment

Figure 5:
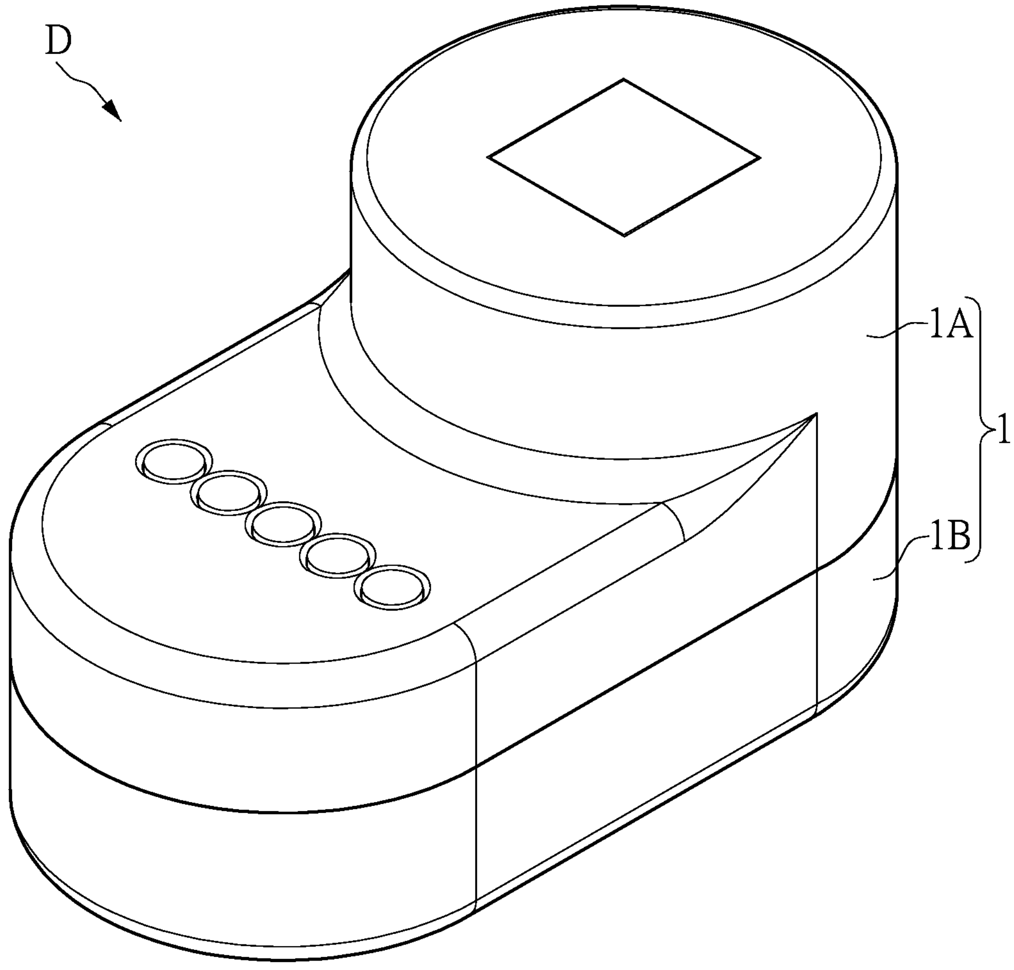
FIG. 5 is a schematic view of an electronic device according to a second embodiment of the present disclosure.
Figure 6:
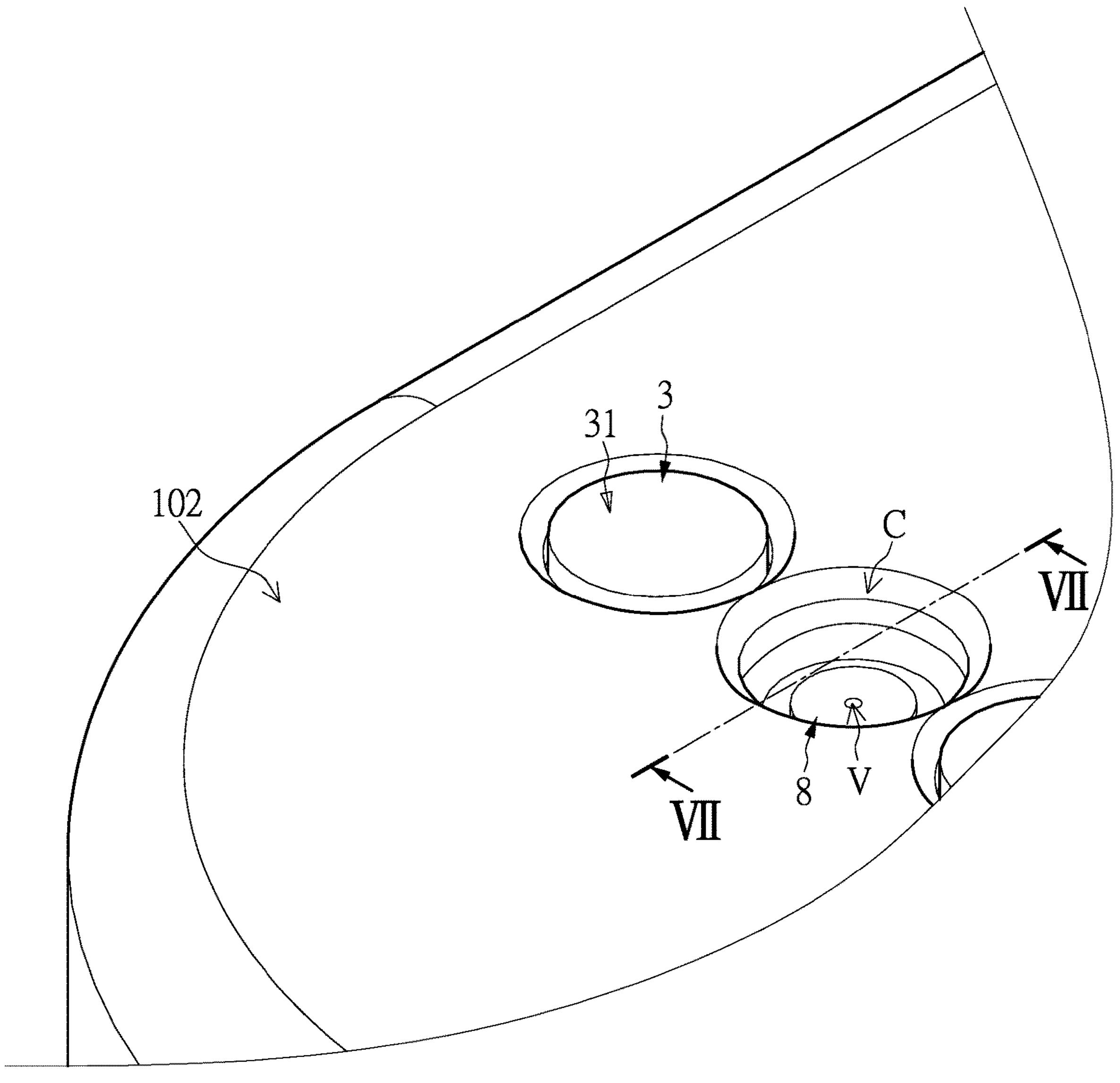
FIG. 6 is a partially enlarged view of the electronic device according to the second embodiment of the present disclosure.
Figure 7:
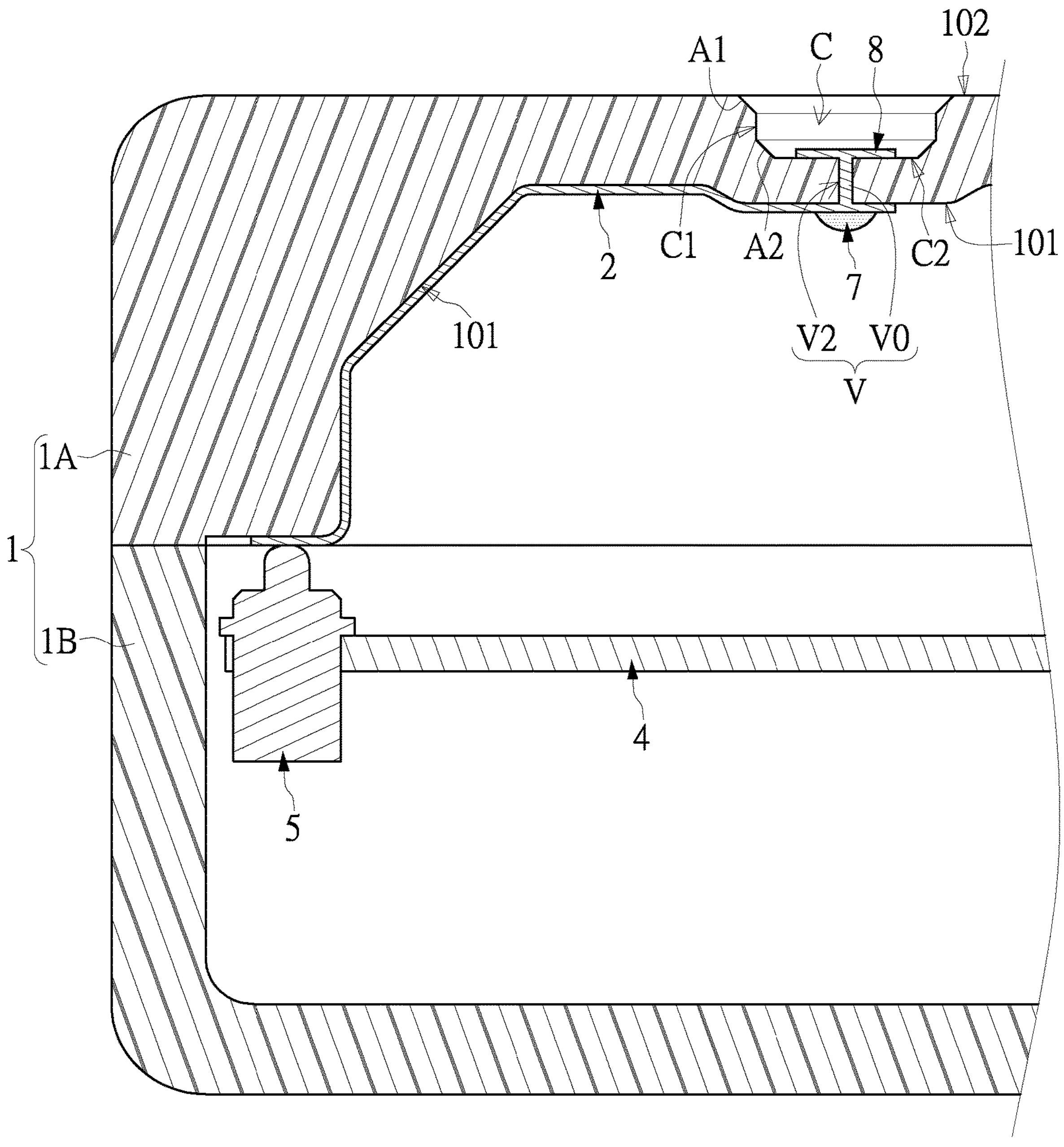
FIG. 7 is a schematic cross-sectional view of a cross-section VII-VII in FIG. 6.

Referring to FIGS. 5 to 7. FIG. 5 is a schematic view of an electronic device according to a second embodiment of the present disclosure. FIG. 6 is a partially enlarged view of the electronic device according to the second embodiment of the present disclosure. FIG. 7 is a schematic cross-sectional view of a cross-section VII-VII in FIG. 6. The second embodiment provides an electronic device D including an outer casing 1, a first metal trace 2, a conductive pillar 3, a circuit board 4, and a metal connecting element 5. The outer casing 1 includes a housing 1A and a lower housing cover 1B. The housing 1A includes a conductive via V and a concave hole C, and the conductive via V and the concave hole C are disposed on the housing 1A. The structure and structuring method of the electronic device D of the second embodiment are similar to those of the first embodiment, and the details of the similarities will not be repeated herein.

As shown in FIGS. 6 and 7, the main difference between the electronic device D of the second embodiment and that of the first embodiment is that, in the electronic device D of the second embodiment the concave hole C is above the conductive via V, and the concave hole C is communicated with the conductive via V. In other words, the housing 1A has no structure of the inclined groove 11. It is noted that, to clearly show the relative relationship between the conductive via V and the concave hole C, one of the concave holes C in FIG. 6 omits the conductive pillar 3.

In the second embodiment, the conductive via V is formed in a way of laser drilling through the housing 1A. Furthermore, the conductive via V is formed first by laser penetrating through the housing 1A to form a through hole, and then by metalizing the inner surface of the through hole. Therefore, the conductive via V includes a through hole V2 passing through the housing 1A and a metal layer V0 disposed on an inner surface of through hole V2. The metalizing process of the inner surface of the through hole may include LAP, LCP, LCS, CPS, PVD, LSP, and PDS as mentioned in the first embodiment, and the present disclosure is not limited thereto.

In addition, the electronic device D further includes a metal portion 8. The metal portion 8 can be formed by the surface metallization process as mentioned, and will not be repeated herein. The conductive via V is extended to the metal portion 8. The conductive via V is electrically connected between the first metal trace 2 and the metal portion 8. The conductive pillar 3 is disposed in the concave hole C, and is connected to the metal portion 8 through soldering, so that the metal portion 8 is electrically connected to the conductive pillar 3 and the conductive via V. In this way, the conductive pillar 3 can be electrically connected to the first metal trace 2 through the metal portion 8 and the conductive via V, and then electrically connected to the metal connecting element 5 through the first metal trace 2. The metal connecting element 5 is disposed on the circuit board and electrically connected to an electronic component (not shown in figures) disposed on the circuit board 4. For example, the electronic component can be, i.e., a battery or other IC elements, and the present disclosure is not limited thereto. Therefore, the metal portion 8, the conductive via V, the first metal trace 2, and the metal connecting element 5 form a conductive path between the conductive pillar 3 and the electronic component. When the electronic component is a battery, the electronic device D can be electrically connected to an external power source by using the conductive pillar 3, and charge the battery through the conductive path.

In addition, the electronic device D further includes a waterproof element 7. The waterproof element 7 is disposed on the side of the conductive via V facing the inner surface 101 of the housing 1A. The waterproof element 7 can be filled with dispensing glue or covered with waterproof adhesive. It is noted that, in the second embodiment, since the side of the conductive via V facing the outer surface 102 is provided with a concave hole C, and the conductive pillar 3 is disposed in the concave hole C and is connected to the metal portion 8 through soldering, and further the diameter of the conductive via V formed by laser drilling is quite small (between 0.08 mm and 0.3 mm), making it difficult for external moisture to penetrate into the electronic device D from the concave hole C and the conductive via V. Therefore, the electronic device D provided by the second embodiment may not be provided with the waterproof element 7. In addition, the present disclosure is not limited to the way of connecting the conductive pillar 3 to the metal portion 8. Besides soldering, the conductive pillar 3 can also be connected to the metal portion 8 by reflow or conductive glue to achieve electrical conduction with the conductive via V.

BENEFICIAL EFFECTS OF THE EMBODIMENTS

One of the beneficial effects of the present disclosure is that the electronic device D provided by the present disclosure can replace cables or multiple sub-boards of the prior art by utilizing the technical solution of "the first metal trace 2 disposed on the inner surface of the housing 1A, and the conductive via V electrically connected to one end of the first metal trace 2", "the conductive pillar 3 disposed in the concave hole C and exposed from the housing 1, and the conductive pillar 3 electrically connected to the conductive via V", and "the metal connecting element 5 disposed on the circuit board 4 and electrically connected to the first metal trace 2", and through the use of a plastic surface metallization process to form a conductive circuit on the inner surface of the housing. The conductive circuit can be freely designed on the inner surface of the housing based on the visible conductive pillar positions, and the internal and external circuits are connected through conductive via. In addition, the conductive circuit and the circuit board can be electrically connected through metal connecting elements. Since the conductive circuit is freely designed on the inner surface of the housing, the metal connecting elements are not limited to being placed below the charging terminals. As a result, the metal connecting elements do not occupy space on the main circuit board, so as to improve the utilization of internal space in the product and eliminate constraints on the circuit layout of the main circuit board due to limited space. Furthermore, through the plastic metallization process, some electronic components can be arranged on a plastic carrier, which helps further improve space utilization and achieve the goal of miniaturizing electronic products.

Furthermore, the conductive via V can be a through hole formed by injection molding, and the conductive via V can be electrically connected to the metal connecting element on the circuit board through the first metal trace 2, and can also be electrically connected to the conductive pillar 3 in the concave hole C through the second metal trace 6. In this way, the second metal trace 6, the conductive via V, the first metal trace 2, and the metal connecting element 5 form a conductive path between the conductive pillar 3 and the electronic component on the circuit board 4. In addition, the design of the first rounded structure B1 and the second rounded structure B2, and the design of the conical hole wall V1 and the slope surface 11S facilitate the formation of surface metallization (i.e., facilitate the formation of the second metal trace 6) using the LDS method on its surface.

Furthermore, the conductive via V can also be a through hole formed by laser drilling, and the conductive via V is communicated with the concave hole C. The conductive via V can be electrically connected to the metal connecting element on the circuit board 4 through the first metal trace 2, and can also be electrically connected to the conductive pillar 3 in the concave hoe C through the metal portion 8. Thus, the metal portion 8, the conductive via V, the first metal trace 2, and the metal connecting element 5 form a conductive path between the conductive pillar 3 and the electronic component on the circuit board 4.

The foregoing description of the disclosure has been presented only for the purposes of illustration and description option of the exemplary embodiments and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use. Alternative embodiments will become apparent to those skilled in the art to which the present disclosure pertains without departing from its spirit and scope.

What is claimed is:

1. An electronic device, comprising:

a housing comprising a conductive via and a concave hole, wherein the conductive via is located outside the concave hole and passes through the housing;

a first metal trace disposed on an inner surface of the housing, the conductive via electrically connected to the first metal trace;

a conductive pillar disposed in the concave hole and exposed from the housing, the conductive pillar electrically connected to the conductive via;

a second metal trace disposed on an outer surface of the housing, wherein the concave hole is adjacent to the conductive via, one end of the second metal trace is electrically connected to the conductive via, and another end of the second metal trace is extended into the concave hole and electrically connected to the conductive pillar;

a circuit board disposed inside the housing; and a metal connecting element disposed on the circuit board and electrically connected to the first metal trace.

2. The electronic device according to claim 1, wherein a height of the conductive pillar is not greater than a depth of the concave hole.

3. The electronic device according to claim 2, wherein a first chamfered structure is formed between the outer surface of the housing and an inner sidewall of the concave hole, and a second chamfered structure is formed between the inner sidewall of the concave hole and a bottom surface of the concave hole.

4. The electronic device according to claim 1, wherein the housing has an inclined groove communicated with the concave hole and disposed between the conductive via and the concave hole, and the inclined groove has a slope surface sloping downward from a side near the conductive via to a side near the concave hole.

5. The electronic device according to claim 4, wherein the slope surface has an inclination angle with respect to a horizontal plane, the inclination angle is greater than 30 degrees, and a rounded structure is formed between the slope surface and the outer surface of the housing.

6. The electronic device according to claim 4, wherein the conductive via forms a conical hole wall on the side facing the outer surface, the conical hole wall has an inclination angle with respect to a horizontal plane, the inclination angle is greater than 30 degrees, and a rounded structure is formed between the conical hole wall and the outer surface of the housing.

7. The electronic device according to claim 4, wherein the conductive via is formed by an injection molding process.

8. The electronic device according to claim 7, further comprising a waterproof element disposed on the side of the conductive via facing the outer surface or the side of the conductive via facing the inner surface.

9. An electronic device, comprising:

a housing comprising a conductive via and a concave hole, wherein the conductive via includes a through hole passing through the housing and a metal layer disposed on an inner surface of the through hole;

a first metal trace disposed on an inner surface of the housing, the conductive via electrically connected to the first metal trace;

a conductive pillar disposed in the concave hole and exposed from the housing, the conductive pillar electrically connected to the conductive via;

a circuit board disposed inside the housing;

a metal connecting element disposed on the circuit board and electrically connected to the first metal trace; and a metal portion disposed on a bottom surface of the concave hole, wherein the concave hole is communicated with the conductive via, the metal portion is electrically connected to the conductive pillar and the conductive via, and the metal portion is disposed between the conductive via and the conductive pillar.

10. The electronic device according to claim 9, wherein the conductive via is formed by laser drilling through the housing.

11. The electronic device according to claim 10, further comprising a waterproof element disposed on the side of the conductive via facing the inner surface.

12. The electronic device according to claim 1, wherein the metal connecting element is disposed on an edge of the circuit board.

13. The electronic device according to claim 9, wherein a height of the conductive pillar is not greater than a depth of the concave hole.

* * * * *